US009559294B2

(12) United States Patent
Hsu et al.

(10) Patent No.: US 9,559,294 B2
(45) Date of Patent: Jan. 31, 2017

(54) SELF-ALIGNED MAGNETORESISTIVE RANDOM-ACCESS MEMORY (MRAM) STRUCTURE FOR PROCESS DAMAGE MINIMIZATION

(71) Applicant: Taiwan Semiconductor Manufacturing Co., Ltd., Hsin-Chu (TW)

(72) Inventors: Chern-Yow Hsu, Chu-Bei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/608,313

(22) Filed: Jan. 29, 2015

(65) Prior Publication Data

US 2016/0225979 A1   Aug. 4, 2016

(51) Int. Cl.
| | | |
|---|---|---|
| *H01L 21/00* | (2006.01) | |
| *H01L 29/82* | (2006.01) | |
| *H01L 43/08* | (2006.01) | |
| *H01L 43/02* | (2006.01) | |
| *H01L 43/12* | (2006.01) | |
| *H01L 27/22* | (2006.01) | |

(52) U.S. Cl.
CPC ............... *H01L 43/08* (2013.01); *H01L 43/02* (2013.01); *H01L 43/12* (2013.01); *H01L 27/222* (2013.01)

(58) Field of Classification Search
CPC .............................. H01L 43/08; H01L 27/222
USPC ................................................ 257/421; 438/3
See application file for complete search history.

(56) References Cited

U.S. PATENT DOCUMENTS

| | | | |
|---|---|---|---|
| 6,897,532 B1 * | 5/2005 | Schwarz ................ | B82Y 25/00 257/367 |
| 7,416,945 B1 | 8/2008 | Muralidhar et al. | |
| 7,932,189 B2 | 4/2011 | Merchant et al. | |
| 8,546,871 B2 * | 10/2013 | Huang .............. | H01L 29/66833 257/324 |
| 8,747,680 B1 * | 6/2014 | Deshpande .............. | G11B 5/84 216/22 |
| 8,923,044 B2 | 12/2014 | Li et al. | |

(Continued)

OTHER PUBLICATIONS

Notice of Allowance Dated Sep. 23, 2015 U.S. Appl. No. 14/023,552.
Sungwook Jung, et al.; "Fabrication of Needle-Like Nanostructures Using Block Copolymer for Non-Volatile Memory"; Materials Science and Engineering; www.elsevier.com/locate/msec; C27, 2007, p. 1452-1455.

(Continued)

*Primary Examiner* — David Vu
*Assistant Examiner* — Brandon Fox
(74) *Attorney, Agent, or Firm* — Eschweiler & Associates, LLC (57) ABSTRACT

A magnetoresistive random-access memory (MRAM) cell with a dual sidewall spacer structure is provided. The MRAM cell includes an anti-ferromagnetic layer, a pin layer, a free layer, a first sidewall spacer layer, and a second sidewall spacer layer. The pin layer is arranged over the anti-ferromagnetic layer and has a fixed magnetic polarity. The free layer is arranged over the pin layer and has a variable magnetic polarity. The first sidewall spacer layer extends from over the pin layer along sidewalls of the free layer. The second sidewall spacer layer extends from over the anti-ferromagnetic layer along sidewalls of the pin layer and the first sidewall spacer layer. A method for manufacturing the MRAM cell is also provided.

20 Claims, 8 Drawing Sheets

(56) References Cited

U.S. PATENT DOCUMENTS

| | | |
|---|---|---|
| 2004/0205958 A1 | 10/2004 | Grynkewich et al. |
| 2009/0209050 A1 | 8/2009 | Wang et al. |
| 2010/0102406 A1 | 4/2010 | Xi et al. |
| 2010/0117169 A1* | 5/2010 | Anderson ............... H01L 43/08 257/421 |
| 2011/0008956 A1 | 1/2011 | Lee et al. |
| 2011/0049656 A1 | 3/2011 | Li et al. |
| 2011/0076784 A1 | 3/2011 | Druist et al. |
| 2011/0104827 A1 | 5/2011 | Gaidis |
| 2011/0235217 A1* | 9/2011 | Chen ...................... H01L 43/12 360/324.2 |
| 2012/0205764 A1 | 8/2012 | Chen et al. |
| 2013/0062714 A1 | 3/2013 | Zhu et al. |
| 2013/0337582 A1 | 12/2013 | Satoh et al. |
| 2015/0021725 A1 | 1/2015 | Hsu et al. |
| 2015/0102006 A1* | 4/2015 | Mudivarthi ............. H01L 43/12 216/11 |
| 2015/0171314 A1* | 6/2015 | Li ........................ G11C 11/161 257/421 |
| 2015/0255507 A1 | 9/2015 | Pakala et al. |
| 2015/0287910 A1* | 10/2015 | Lu .......................... H01L 43/02 257/421 |

OTHER PUBLICATIONS

Hiratsuka, et al. "Fabrication of perpendicularly magnetized magnetic tunnel junctions with L10-CoPt/Co2MnSi hybrid electrode." Journal of Applied Physics 107, 09C714 (2010). May 6, 2010.

Endoh "Emerging Research Memory Technologies Spin Transfer Torque MRAM (SPRAM) and its Applications." Feb. 28, 2010.

Natarajarathinam. "Exploration of Perpendicular Magnetic Anisotropy Material System for Application in Spin Transfer Torque—Random Access Memory (STT-RAM)." Tuscaloosa, Alabama, 2012.

U.S. Appl. No. 14/023,552, filed Sep. 11, 2013.

U.S. Appl. No. 14/645,683, filed Mar. 12, 2015.

Non Final Office Action Dated May 26, 2015 U.S. Appl. No. 14/023,552.

Y. J. Lee, et al., "Demonstration of Chip Level Writability, Endurance and Data Retention of an Entire 8MB STT-MRAM Array," 2013 International Symposium on VLSI Technology, Systems, and Applications (VLSI-TSA), p. 1-2, Apr. 22-24, 2013.

Non-Final Office Action dated Jun. 17, 2016 for U.S. Appl. No. 14/645,683.

* cited by examiner

SELF-ALIGNED MAGNETORESISTIVE RANDOM-ACCESS MEMORY (MRAM) STRUCTURE FOR PROCESS DAMAGE MINIMIZATION

BACKGROUND

Many modern day electronic devices contain electronic memory. Electronic memory may be volatile memory or non-volatile memory. Non-volatile memory is able to store data in the absence of power, whereas volatile memory is not. Magnetoresistive random-access memory (MRAM) is one promising candidate for next generation electronic memory due to advantages over current electronic memory. Compared to current non-volatile memory, such as flash random-access memory, MRAM typically is faster and has better endurance. Compared to current volatile memory, such as dynamic random-access memory (DRAM) and static random-access memory (SRAM), MRAM typically has similar performance and density, but lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

A magnetoresistive random-access memory (MRAM) cell includes a pair of electrode layers and a magnetic tunneling junction (MTJ) arranged between the electrode layers. The MTJ includes a pair of ferromagnetic layers and a barrier layer arranged between the ferromagnetic layers. The ferromagnetic layers include a pin layer and a free layer. The pin layer has a permanent or fixed magnetic polarity, typically pinned by an anti-ferromagnetic layer arranged between one of the electrode layers and the pin layer. The free layer has a variable magnetic polarity representing a unit of data, such as a bit of data.

In operation, the variable magnetic polarity is typically read by measuring the resistance of the MTJ. Due to the magnetic tunnel effect, the resistance of the MRAM cell changes with the variable magnetic polarity. Further, in operation, the variable magnetic polarity is typically changed or toggled using the spin-transfer torque (STT) effect. According to the spin-transfer torque (STT) effect, current is passed across the MTJ to induce a flow of electrons from the pin layer to the free layer. As electrons pass through the pin layer, the spins of the electrons are polarized. When the spin-polarized electrons reach the free layer, the spin-polarized electrons apply a torque to the variable magnetic polarity and toggle the state of the variable magnetic polarity.

According to some methods for manufacturing an MRAM cell, an anti-ferromagnetic layer, a pin layer, a barrier layer, and a free layer are stacked in that order over a bottom electrode layer. A single plasma etch is then performed to the bottom electrode layer through regions of the anti-ferromagnetic layer, the pin layer, the barrier layer, and the free layer surrounding a device region of the stack. A shortcoming with forming the MRAM cell according to these methods is that the free layer and the pin layer are exposed to the plasma for more time than needed to etch through the respective thicknesses of the free layer and the pin layer. For example, the pin layer and the free layer are exposed to the plasma while etching through the anti-ferromagnetic layer. The excess exposure can lead to plasma damage of the free layer and the pin layer, and/or by-product from the plasma etch re-depositing on sidewalls of the pin layer and the free layer. The plasma damage and/or by-product re-deposition can lead to increased leakage current and/or reduced data retention.

In view of the foregoing, the present application is directed to a method for manufacturing a MRAM cell having a dual sidewall spacer structure. The present application is also directed to the resulting MRAM cell. In accordance with the method, a bottom electrode layer, an anti-ferromagnetic layer, a pin layer, a barrier layer, a free layer, a top electrode layer, and a hard mask layer are stacked in that order. A first etch is then performed to the barrier layer through regions of the hard mask, top electrode, and free layers surrounding a device region of the stack. A first sidewall spacer layer is formed over the barrier layer, and lining the remaining free, top electrode, and hard mask layers. A second etch is performed: 1) into the first sidewall spacer layer to remove lateral stretches; and 2) to the anti-ferromagnetic layer through regions of the barrier and pin layers unmasked by the remaining hard mask layer and the remaining first sidewall spacer layer. A second sidewall spacer layer is formed over the anti-ferromagnetic layer, and lining the remaining pin, barrier and first sidewall spacer layers. A third etch is performed: 1) into the second sidewall spacer layer to remove lateral stretches; and 2) through regions of the anti-ferromagnetic layer and the bottom electrode layer unmasked by the remaining hard mask, first sidewall spacer, and second sidewall spacer layers.

Advantageously, by forming the MRAM cell with a dual sidewall spacer structure, the amount of time that the free layer and the pin layer are exposed to etchants is minimized. For example, the amount of time that the free layer is exposed to etchants is limited to the amount of time it takes to etch through the free layer. As another example, the amount of time that the pin layer is exposed to etchants is limited to the amount of time it takes to etch through the pin layer. By reducing the exposure time of the free layer and the pin layer, etching damage to the free layer and the pin layer is minimized. Further, by-product re-deposition along sidewalls of the free layer and the pin layer is minimized.

Figure 1:
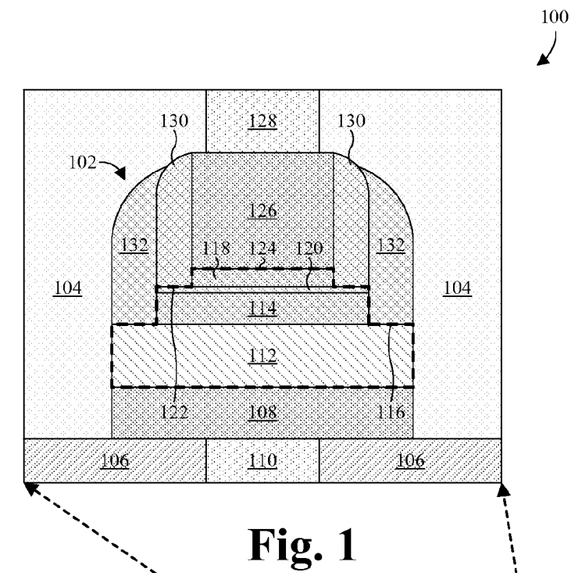
FIG. 1 illustrates a cross-sectional view of some embodiments of a semiconductor structure including a magnetoresistive random-access memory (MRAM) cell with a dual sidewall spacer structure.

With reference to FIG. 1, a cross-sectional view 100 of some embodiments of a semiconductor structure of a back end of line (BEOL) metallization stack is provided. The semiconductor structure includes a MRAM cell 102. The MRAM cell 102 is arranged within an interlayer dielectric (ILD) layer 104 and over an etch stop layer 106. The ILD layer 104 may be, for example, a low κ dielectric (i.e., a dielectric with a dielectric constant κ less than 3.9) or an oxide (e.g., silicon dioxide). The etch stop layer 106 may be, for example, silicon nitride.

A bottom electrode layer 108 of the MRAM cell 102 is arranged over the etch stop layer 106, and electrically coupled to a first metallization layer (not shown) of the BEOL metallization stack by a first via 110. The first via 110 extends from the bottom electrode layer 108, through the etch stop layer 106, to the first metallization layer. The bottom electrode layer 108 may be a conductive material, such as, for example, titanium nitride, tantalum nitride, titanium, tantalum, or a combination of one or more of the foregoing. Further, the bottom electrode layer 108 may be, for example, about 10-100 nanometers thick. The first via 110 may be, for example, a metal, such as copper, gold or tungsten.

An anti-ferromagnetic layer 112 and a pin layer 114, of the MRAM cell 102, are stacked over the bottom electrode layer 108. The anti-ferromagnetic layer 112 is arranged under, and typically abutting the pin layer 114. The anti-ferromagnetic layer 112 pins the pin layer 114 to a permanent or fixed magnetic polarity. The anti-ferromagnetic layer 112 typically has the same footprint as the bottom electrode layer 108, and the pin layer 114 typically has a smaller footprint than the anti-ferromagnetic layer 112. Due to the difference in footprints, the anti-ferromagnetic layer 112 and the pin layer 114 collectively define a first ledge 116. The anti-ferromagnetic layer 112 may be, for example, platinum, cobalt, manganese, or a combination of one or more of the foregoing. Further, the anti-ferromagnetic layer 112 may be, for example, about 9-20 nanometers thick. The pin layer 114 may be a ferromagnetic material, such as, for example, cobalt, iron, boron, ruthenium, or a combination of one or more of the foregoing. Further, the pin layer 114 may be, for example, about 5-10 nanometers thick.

A free layer 118 of the MRAM cell 102 is arranged over the pin layer 114. The free layer 118 has a smaller footprint than the pin layer 114, and has a variable magnetic polarity representing a unit of data. For example, the variable magnetic polarity switches between a first state and a second state that respectively represent a binary "0" and a binary "1". The free layer 118 may be a ferromagnetic material, such as, for example, cobalt, iron, boron, or a combination of one or more of the foregoing. Further, the free layer 118 is typically thinner than the pin layer 114 and may be, for example, about 1-3 nanometers thick.

A barrier layer 120 of the MRAM cell 102 is arranged abutting and between the free layer 118 and the pin layer 114. The barrier layer 120 provides electrical isolation between the free layer 118 and the pin layer 114, while still allowing electrons to tunnel through the barrier layer 120 under proper conditions. The barrier layer 120 typically has the same footprint as the pin layer 114 and a larger footprint than the free layer 118. Due to the difference in footprints, the barrier layer 120 and the free layer 118 collectively define a second ledge 122. The barrier layer 120 may be, for example, magnesium oxide or aluminum oxide (e.g., $Al_2O_3$). Further, the barrier layer 120 may be, for example, about 0.5-2 nanometers thick.

The free layer 118, the pin layer 114, the anti-ferromagnetic layer 112, and the barrier layer 120 collectively define a MTJ 124 of the MRAM cell 102. In operation, the variable magnetic polarity of the free layer 118 is typically read by measuring the resistance of the MTJ 124. Due to the magnetic tunnel effect, the resistance of the MTJ 124 changes with the variable magnetic polarity. Further, in operation, the variable magnetic polarity is typically changed or toggled using the STT effect. According to the STT effect, current is passed across the MTJ 124 to induce a flow of electrons from the pin layer 114 to the free layer 118. As electrons pass through the pin layer 114, the spins of the electrons are polarized. When the spin-polarized electrons reach the free layer 118, the spin-polarized electrons apply a torque to the variable magnetic polarity and toggle the state of the variable magnetic polarity. Alternative approaches to reading or changing the variable magnetic polarity are also amenable.

A top electrode layer 126 of the MRAM cell 102 is arranged over the free layer 118, and electrically coupled to a second metallization layer (not shown) of the BEOL metallization stack by a second via 128. The second via 128 extends from the top electrode layer 126, through the ILD layer 104, to the second metallization layer. The top electrode layer 126 may be a conductive material, such as, for example, titanium nitride, tantalum nitride, titanium, tantalum, or a combination of one or more of the foregoing. Further, the top electrode layer 126 may be, for example, about 10-100 nanometers thick. The second via 128 may be, for example, a metal, such as copper or tungsten.

A first sidewall spacer layer 130 extends from the second ledge 122 and is arranged along the sidewalls of the free layer 118 and the top electrode layer 126. Further, a second sidewall spacer layer 132 extends from the first ledge 116 and is arranged along sidewalls of the pin layer 114, the barrier layer 120, and the first sidewall spacer layer 130. As described in greater detail hereafter, the first and second sidewall spacer layers 130, 132 advantageously protect the free and barrier layers 118, 120 from damage during the manufacture of the MRAM cell 102. The first and second sidewall spacer layers 130, 132 may be, for example, silicon nitride, silicon carbide, or a combination of one or more of the foregoing. Further, the first and second sidewall spacer layers 130, 132 may be, for example, about 2-5 nanometers wide.

Figure 2:
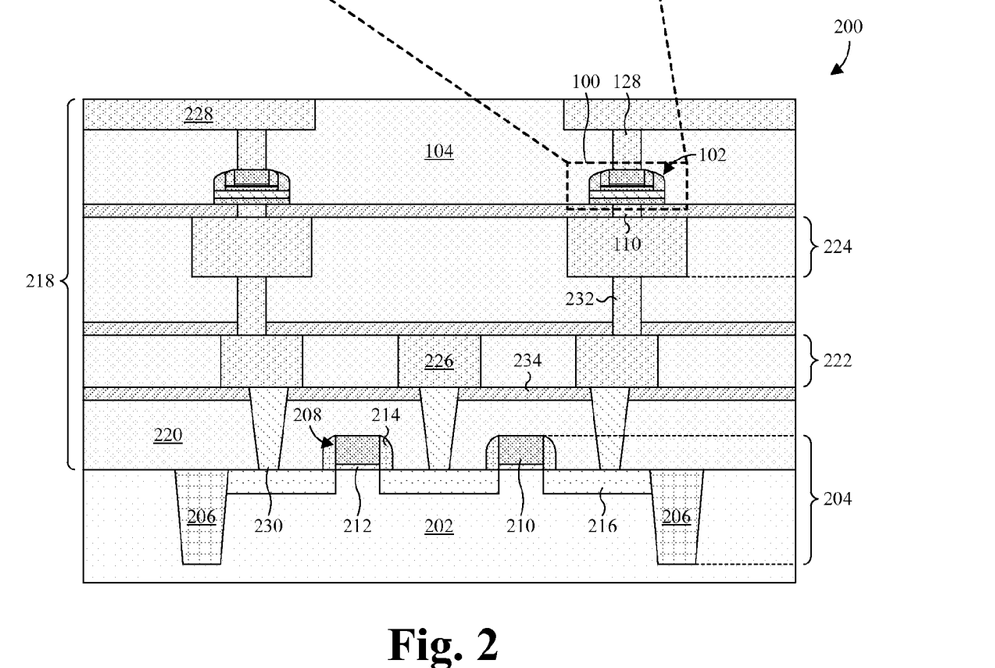
FIG. 2 illustrates a cross-sectional view of some embodiments of an integrated circuit including a MRAM cell with a dual sidewall spacer structure.

With reference to FIG. 2, a cross-sectional 200 view of some embodiments of an integrated circuit is provided. The integrated circuit includes a semiconductor substrate 202 over and/or within which a device layer 204 is arranged. The semiconductor substrate 202 may be, for example, a bulk substrate (e.g., a bulk silicon substrate) or a silicon-on-insulator (SOI) substrate. The device layer 204 includes one or more shallow trench isolation (STI) regions 206 and two word line transistors 208 spaced between the STI regions 206. The STI regions 206 may be, or otherwise include, an oxide-filled trench within the semiconductor substrate 202.

The word line transistors 208 extend parallel to each other, and include word line gates 210, word line dielectric layers 212, word line sidewall spacer layers 214, and source/drain regions 216. The word line gates 210 are arranged over corresponding word line dielectric layers 212, and lined by corresponding word line sidewall spacer layers 214. The source/drain regions 216 are embedded within the surface of the semiconductor substrate 202 between the word line gates 210 and the STI regions 206. The word line gates 210 may be, for example, doped polysilicon or a metal, such as titanium nitride or tantalum nitride. The word line dielectric layers 212 may be, for example, an oxide, such as silicon dioxide. The word line sidewall spacer layers 214 may be, for example, silicon nitride. The source/drain regions 216 correspond to, for example, doped regions of the semiconductor substrate 202.

A BEOL metallization stack 218 is arranged over the device layer 204. The BEOL metallization stack 218 includes a plurality of ILD layers 104, 220, a pair of MRAM cells 102, and a plurality of metallization layers 222, 224. The MRAM cells 102 are as described with FIG. 1 and are arranged within the ILD layers 104, 220. The metallization layers 222, 224 include metal lines 226, 228 and are also arranged within the ILD layers 104, 220. The metal lines 226, 228 include a source line 226 arranged parallel to and between the word line transistors 208. Further, the metal lines 226, 228 include bit lines 228 corresponding to the MRAM cells 102 that extend parallel to each other and laterally perpendicular to the word line transistors 208. The ILD layers 104, 220 may be, for example, a low κ dielectric, such as undoped silicate glass, or an oxide, such as silicon dioxide. In some embodiments, the ILD layer 220 immediately over the device layer 204 is an oxide and the other ILD layers 104 are a low κ dielectric. The metallization layers 222, 224 may be, for example, a metal, such as copper or aluminum.

Contacts 230 extend from the metallization layer 222 immediately overlying the device layer 204 to the device layer 204, and vias 110, 128, 232 extend between the metallization layers 222, 224 and the MRAM cells 102. The contacts 230 and the vias 110, 128, 232 extend through etch stop layers 106, 234 arranged between the ILD layers 104, 220 and the metallization layers 222, 224. In some embodiments, the contacts 230 and the vias 110, 128, 232 have different shapes. For example, the contacts 230 may have tapering widths, whereas the vias 110, 128, 232 may have uniform widths. The etch stop layers 106, 234 may be, for example, silicon nitride. The contacts 230 and the vias 110, 128, 232 may be, for example, a metal, such as copper, gold, or tungsten.

Figure 3:
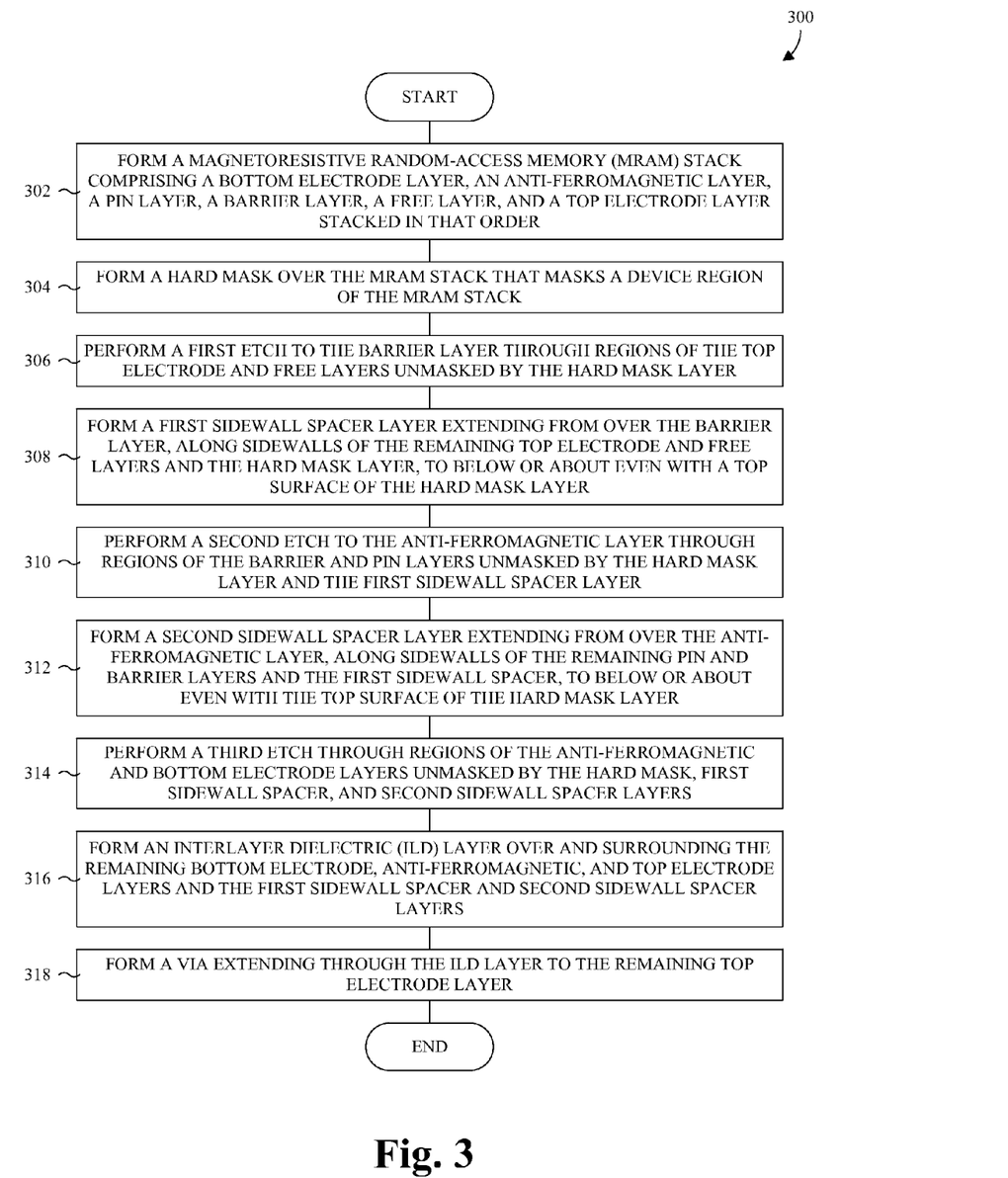
FIG. 3 illustrates a flowchart of some embodiments of a method for manufacturing a semiconductor structure including a MRAM cell with a dual sidewall spacer structure.

With reference to FIG. 3, a flowchart 300 illustrates a flowchart of some embodiments of a method for manufacturing a semiconductor structure having a MRAM cell with a dual sidewall spacer structure.

At 302, a MRAM stack is formed. The MRAM stack includes a bottom electrode layer, an anti-ferromagnetic layer, a pin layer, a barrier layer, a free layer, and a top electrode layer stacked in that order.

At 304, a hard mask layer is formed over the MRAM stack that masks a device region of the MRAM stack.

At 306, a first etch is performed to the barrier layer through regions of the top electrode and free layers unmasked by the hard mask layer.

At 308, a first sidewall spacer layer is formed extending from over the barrier layer, along sidewalls of the remaining top electrode and free layers and the hard mask layer, to below or about even with a top surface of the hard mask layer.

At 310, a second etch is performed to the anti-ferromagnetic layer through regions of the barrier and pin layers unmasked by the hard mask layer and the first sidewall spacer layer.

At 312, a second sidewall spacer layer is formed extending from over the anti-ferromagnetic layer, along the remaining pin and barrier layers and the first sidewall spacer layer, to below or about even with the hard mask layer.

At 314, a third etch is performed through regions of the anti-ferromagnetic layer and the bottom electrode layer unmasked by the hard mask, first sidewall spacer, and second sidewall spacer layers.

At 316, an ILD layer is formed over and surrounding the remaining bottom electrode, anti-ferromagnetic, and top electrode layers and the first sidewall spacer and second sidewall spacer layers.

At 318, a via is formed extending through the ILD layer to the remaining top electrode layer.

Advantageously, by forming the first and second sidewall spacer layers, the amount of time with which the free layer and the pin layer are exposed to etchants is minimized. For example, the free layer is only exposed to an etchant for a period of time sufficient to etch through the free layer. Similarly, the pin layer is only exposed to an etchant for a period of time sufficient to etch through the pin layer. By reducing the exposure time of the free layer and the pin layer, etching damage to the free layer and the pin layer is minimized. Further, by-product re-deposition along sidewalls of the free layer and the pin layer is minimized. Collectively, the reduction in by-product re-deposition and etch damage improves the performance and reliability of the MRAM cell.

While the disclosed method (e.g., the method described by the flowchart 300) is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 4-15, cross-sectional views of some embodiments of a semiconductor structure having an MRAM cell at various stages of manufacture are provided to illustrate the method of FIG. 3. Although FIGS. 4-15 are described in relation to the method, it will be appreciated that the structures disclosed in FIGS. 4-15 are not limited to the method, but instead may stand alone as structures independent of the method. Similarly, although the method is described in relation to FIGS. 4-15, it will be appreciated that the method is not limited to the structures disclosed in FIGS. 4-15, but instead may stand alone independent of the structures disclosed in FIGS. 4-15.

Figure 4:
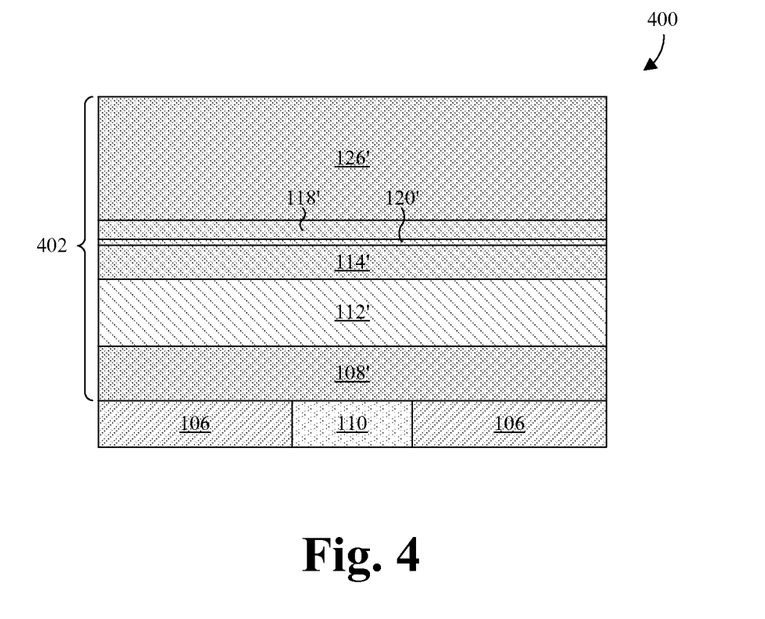
FIGS. 4-15 illustrate a series of cross-sectional views of some embodiments of a semiconductor structure at various stages of manufacture, the semiconductor structure including a MRAM cell with a dual sidewall spacer structure.

FIG. 4 illustrates a cross-sectional view 400 of some embodiments corresponding to Act 302.

As illustrated by FIG. 4, an etch stop layer 106 and a first via 110 are provided. The first via 110 extends through the etch stop layer 106, and has a top surface approximately coplanar with a top surface of the etch stop layer 106. The etch stop layer 106 may be, for example, silicon nitride. The first via 110 may be, for example, a metal, such as copper, aluminum, gold, or tungsten.

Also illustrated by FIG. 4, a MRAM stack 402 is formed over the etch stop layer 106 and the first via 110. The MRAM stack 402 includes a bottom electrode layer 108', an anti-ferromagnetic layer 112', a pin layer 114', a barrier layer 120', a free layer 118', and a top electrode layer 126' stacked in that order. The individual layers 108', 112', 114', 118', 120', 126' of the MRAM stack 402 typically have uniform thickness, and can be formed using any suitable deposition technique, such as chemical vapor deposition (CVD) or physical vapor deposition (PVD).

In some embodiments, the process for forming the MRAM stack 402 includes forming the bottom electrode layer 108' over the etch stop layer 106 and the first via 110, and in electrical communication with the first via 110. The bottom electrode layer 108' may be formed of a conductive material, such as, for example, titanium nitride, tantalum nitride, titanium, tantalum, or a combination of one or more of the foregoing. Further, the bottom electrode layer 108' may be formed with a thickness of, for example, about 10-100 nanometers.

After forming the bottom electrode layer 108', the process continues with forming the anti-ferromagnetic layer 112', the pin layer 114', the barrier layer 120', and the free layer 118' sequentially in that order over the bottom electrode layer 108'. The anti-ferromagnetic layer 112' may be formed of, for example, platinum, cobalt, manganese, or a combination of one or more of the foregoing. Further, the anti-ferromagnetic layer 112' may be formed with a thickness of, for example, about 9-20 nanometers. The pin layer 114' may be formed of a ferromagnetic material, such as, for example, cobalt, iron, boron, ruthenium, or a combination of one or more of the foregoing. Further, the pin layer 114' may be formed with a thickness of, for example, about 5-10 nanometers. The free layer 118' may be formed of a ferromagnetic material, such as, for example, cobalt, iron, boron, or a combination of one or more of the foregoing. Further, the free layer 118' is typically formed thinner than the pin layer 114' and may be formed with a thickness of, for example, about 1-3 nanometers. The barrier layer 120' may be formed of, for example, magnesium oxide or aluminum oxide. Further, the barrier layer 120' may be formed with a thickness of, for example, about 0.5-2 nanometers.

With the free layer 118' formed, the process concludes with forming the top electrode layer 126'. The top electrode layer 126' may be formed of a conductive material, such as, for example, titanium nitride, tantalum nitride, titanium, tantalum, or a combination of one or more of the foregoing. Further, the top electrode layer 126' may be formed with a thickness of, for example, about 10-100 nanometers.

Figure 5:
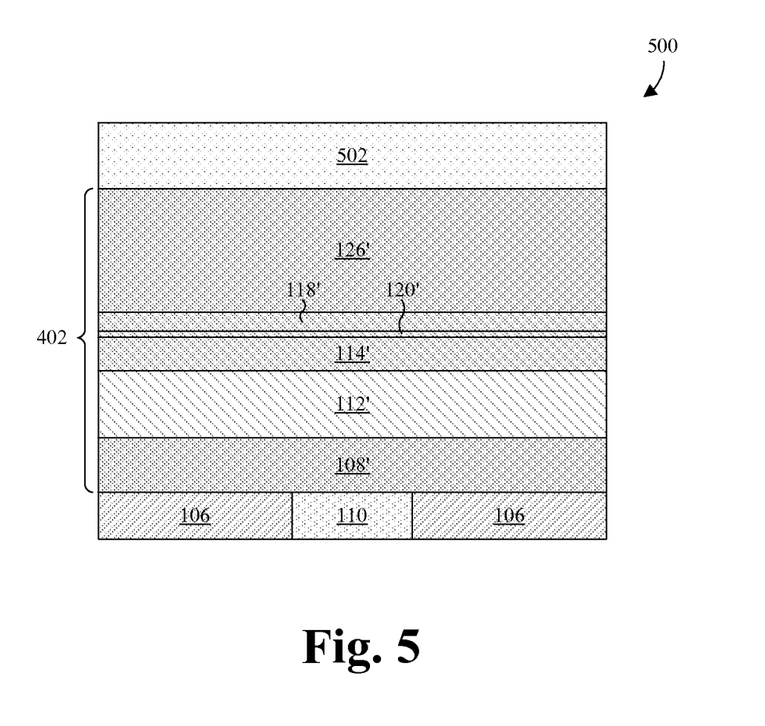
Figure 6:
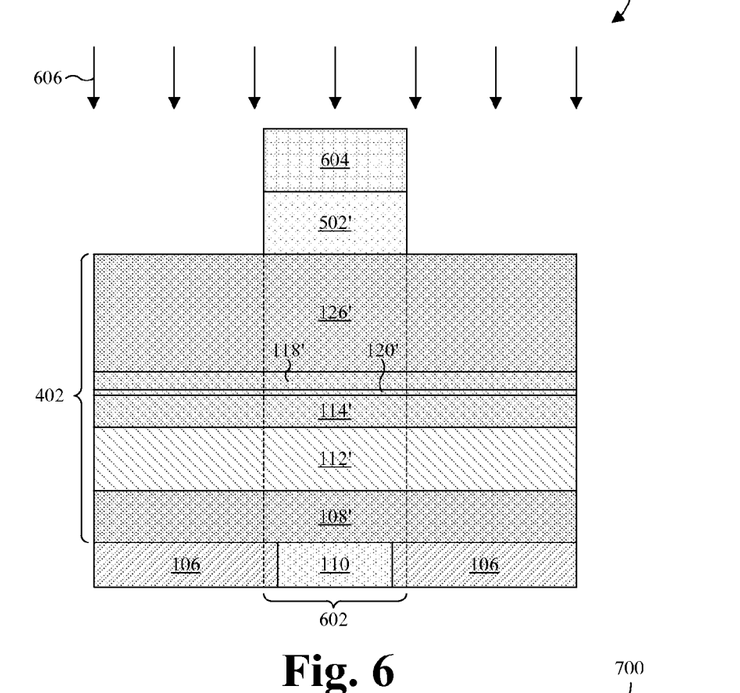

FIGS. 5 and 6 illustrate cross-sectional views 500, 600 of some embodiments corresponding to Act 304.

As illustrated by FIG. 5, a hard mask layer 502 is formed over the MRAM stack 402 using any suitable deposition technique, such as CVD or PVD. The hard mask layer 502 may be formed of, for example, oxide or silicon nitride. Further, the hard mask layer 502 may be formed with a thickness of, for example, about 20-30 nanometers.

As illustrated by FIG. 6, a first etch is performed to the MRAM stack 402 through regions of the hard mask layer 502 surrounding a device region 602 of the MRAM stack 402. In some embodiments, the process for performing the first etch includes forming a photoresist layer over the hard mask layer 502. The photoresist layer is then patterned to mask the device region 602 of the MRAM stack 402, while leaving surrounding regions of the MRAM stack 402 unmasked. With a patterned photoresist layer 604 masking the device region 602, an etchant 606 (e.g., a wet etchant or a plasma etchant) is applied to the hard mask layer 502 for a period of time sufficient to etch through the hard mask layer 502. Subsequently, the patterned photoresist layer 604 is removed. The etchant 606 is typically preferential of the hard mask layer 502 relative to the patterned photoresist layer 604 and the top electrode layer 126'.

Figure 7:
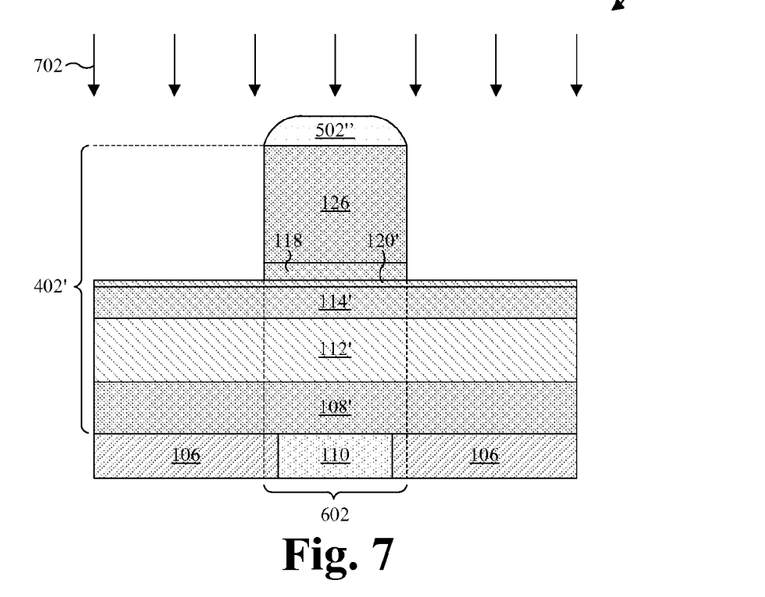

FIG. 7 illustrates a cross-sectional view 700 of some embodiments corresponding to Act 306.

As illustrated, a second etch is performed to the barrier layer 120' through regions of the top electrode layer 126' and the free layer 118' unmasked by the remaining hard mask layer 502'. In some embodiments, the process for performing the second etch includes applying an etchant 702 (e.g., a wet etchant or a plasma etchant) to the MRAM stack 402 for a period of time sufficient to etch to the barrier layer 120'. The etchant 702 is typically preferential of the top electrode and free layers 118', 126' relative to the remaining hard mask layer 502' and the barrier layer 120'. In some embodiments, as illustrated, the etchant 702 may erode the remaining hard mask layer 502'.

Advantageously, the free layer 118' is only exposed to the etchant 702 for a period of time sufficient to etch through the thickness of the free layer 118'. This reduces the likelihood of damage to the free layer 118' and/or the re-deposition of by-product on sidewalls of the free layer 118'. As described above, such damage and/or re-deposition can lead to increased leakage current and/or reduced data retention of the MRAM cell being formed.

Figure 8:
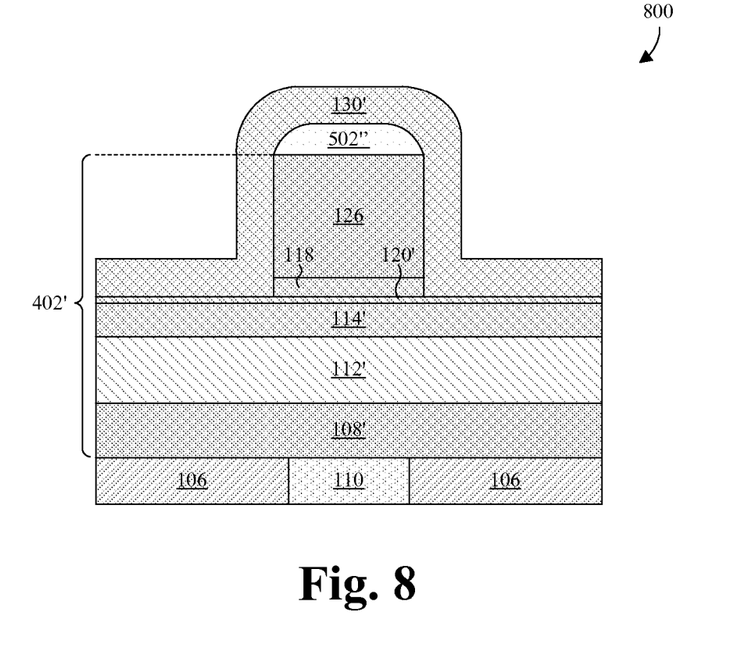
Figure 9:
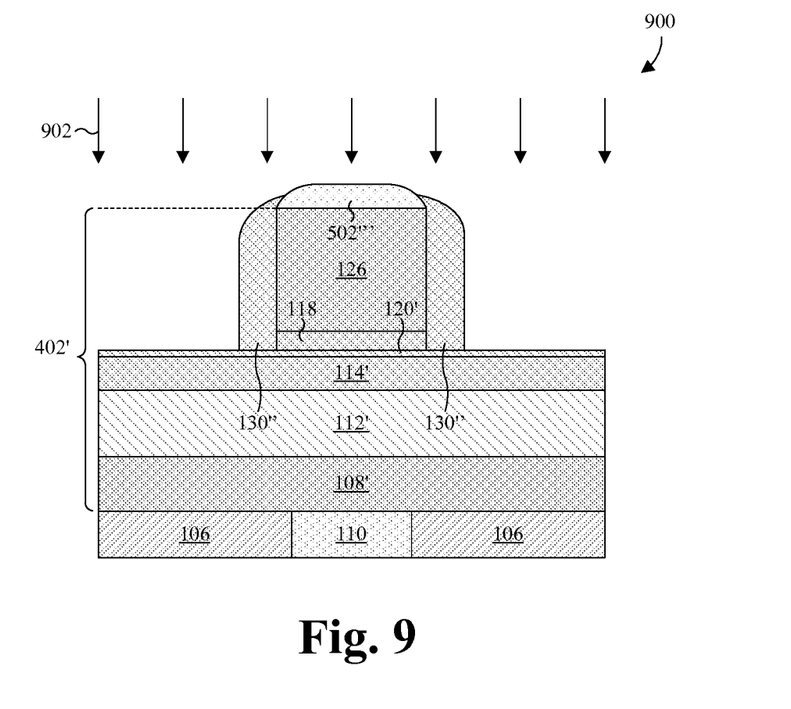

FIGS. 8 and 9 illustrate cross-sectional views 800, 900 of some embodiments corresponding to Act 308.

As illustrated by FIG. 8, a first sidewall spacer layer 130' is formed over the remaining MRAM stack 402' and the barrier layer 120'. Further, the first sidewall spacer layer 130' is formed lining the remaining hard mask, top electrode, and free layers 118, 126, 502''. The first sidewall spacer layer 130' may be formed by any suitable deposition technique and is typically formed conformally. Further, the first sidewall spacer layer 130' may be formed of, for example, silicon nitride, silicon carbide, or a combination of one or more of the foregoing. Even more, the first sidewall spacer layer 130' may be formed with a thickness of, for example, about 2-5 nanometers.

As illustrated by FIG. 9, a third etch is performed into the first sidewall spacer layer 130' to etch first sidewall spacer layer 130' back to below or about even with a top surface of the remaining hard mask layer 502'' and to remove lateral stretches of the first sidewall spacer layer 130'. In some embodiment, the process for performing the third etch includes exposing the first sidewall spacer layer 130' to an etchant 902 for a period of time sufficient to etch through the thickness of the first sidewall spacer layer 130'. The etchant 902 is typically preferential of the first sidewall spacer layer 130' relative to the remaining hard mask layer 502" and the barrier layer 120'. In some embodiments, as illustrated, the etchant 902 may erode the remaining hard mask layer 502".

Figure 10:
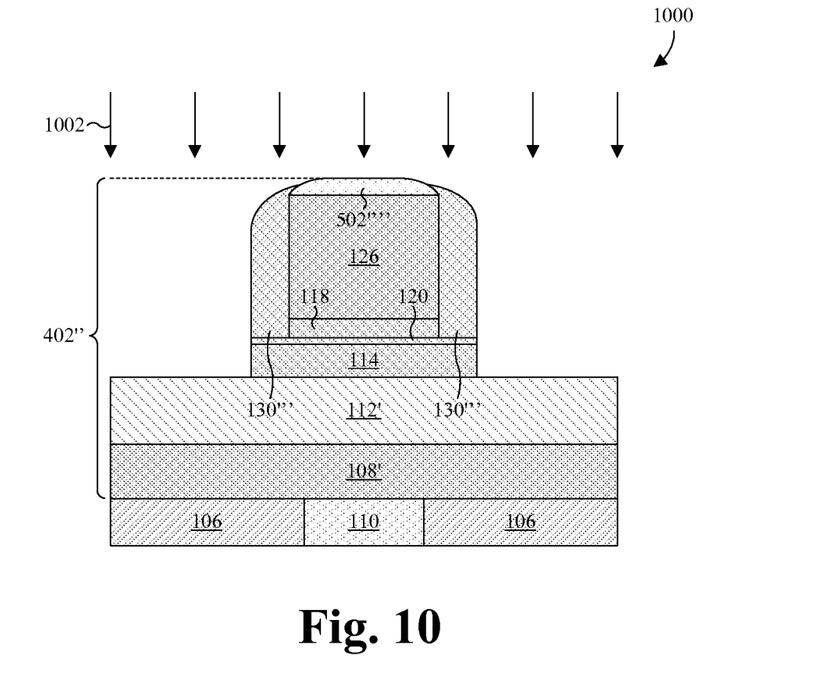

FIG. 10 illustrates a cross-sectional view 1000 of some embodiments corresponding to Act 310.

As illustrated, a fourth etch is performed to the anti-ferromagnetic layer 112' through regions of the barrier layer 120' and the pin layer 114 unmasked by the remaining hard mask layer 502'" and the remaining first sidewall spacer layer 130". The process for the fourth etch may include exposing the barrier layer 120' and the pin layer 114' to an etchant 1002 for a period of time sufficient to etch through the combined thickness of the barrier layer 120' and the pin layer 114'. The etchant 1002 is typically preferential of the barrier layer 120' and the pin layer 114' relative to the remaining hard mask layer 502'" and the anti-ferromagnetic layer 112'. In some embodiments, as illustrated the etchant 1002 may erode the remaining hard mask layer 502'" and/or the remaining first sidewall spacer layer 130".

Advantageously, the pin layer 114' is only exposed to the etchant 1002 for a period of time sufficient to etch through the thickness of the pin layer 114'. Further, the remaining first sidewall spacer layer 130" advantageously protects the remaining free layer 118 from the etchant 1002. The foregoing reduces the likelihood of damage to the pin layer 114' and the remaining free layer 118 from the etchant 1002. Further, the foregoing reduces the likelihood of re-deposition of by-product on sidewalls of the pin layer 114' and the remaining free layer 118. As described above, such damage and/or re-deposition can lead to increased leakage current and/or reduced data retention of the MRAM cell being formed.

Figure 11:
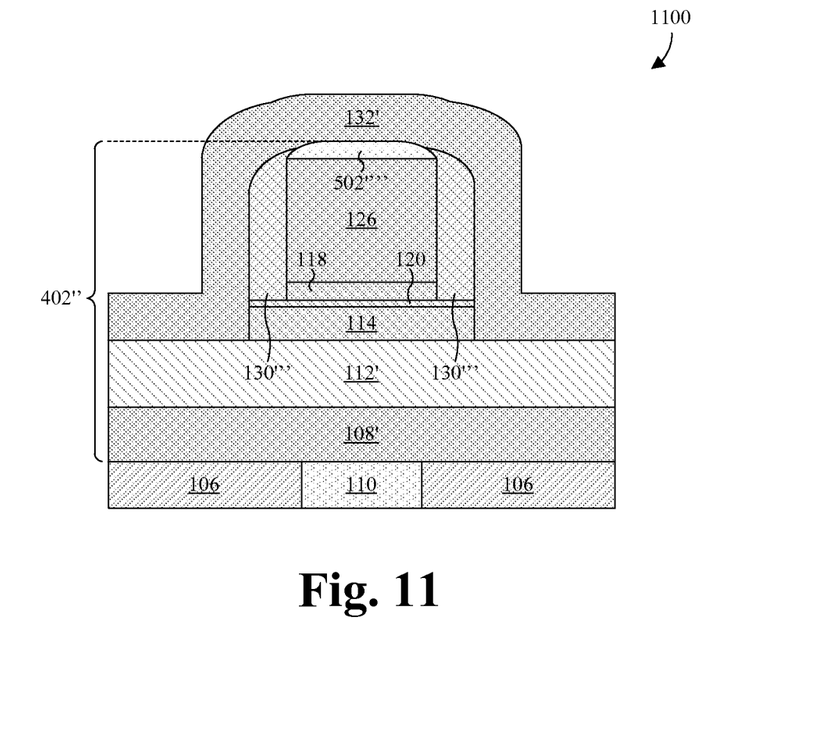
Figure 12:
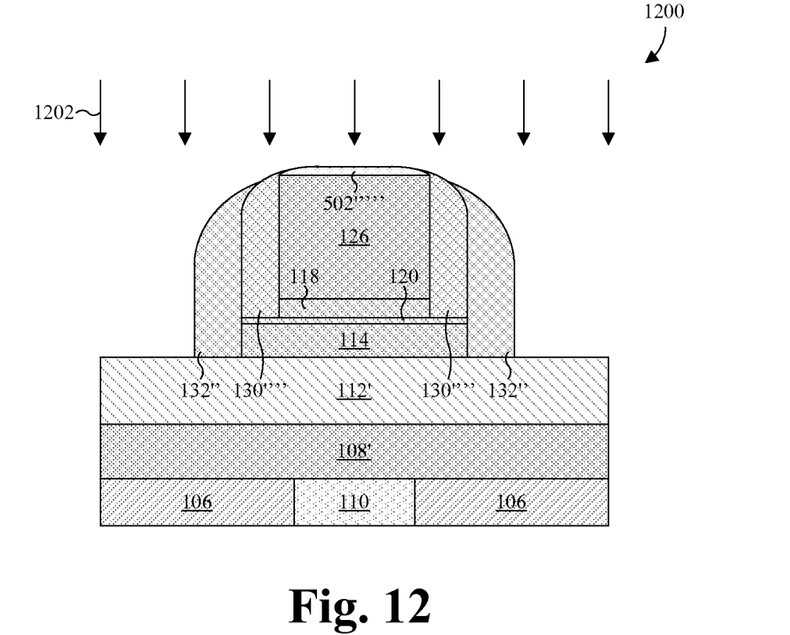

FIGS. 11 and 12 illustrate cross-sectional views 1100, 1200 of some embodiments corresponding to Act 312.

As illustrated by FIG. 11, a second sidewall spacer layer 132' is formed over the remaining MRAM stack 402" and the anti-ferromagnetic layer 112'. Further, the second sidewall spacer layer 132' is formed lining the remaining pin, barrier, first sidewall spacer, and hard mask layers 114, 120, 130'", 502"". The second sidewall spacer layer 132' may be formed by any suitable deposition technique and is typically formed conformally. Further, the second sidewall spacer layer 132' may be formed of, for example, silicon nitride, silicon carbide, or a combination of one or more of the foregoing. Even more, the second sidewall spacer layer 132' may be formed with a thickness of, for example, about 2-5 nanometers.

As illustrated by FIG. 12, a fifth etch is performed into the second sidewall spacer layer 132' to etch second sidewall spacer layer 132' back to below or about even with a top surface of the remaining hard mask layer 502"" and to remove lateral stretches of the second sidewall spacer layer 132'. In some embodiment, the process for performing the fifth etch includes exposing the second sidewall spacer layer 132' to an etchant 1202 for a period of time sufficient to etch through the thickness of the second sidewall spacer layer 132'. The etchant 1202 is typically preferential of the second sidewall spacer layer 132' relative to the remaining hard mask layer 502"" and the anti-ferromagnetic layer 112'. In some embodiments, as illustrated, the etchant 1202 may erode the remaining hard mask layer 502" and/or the remaining first sidewall spacer layer 130'".

Figure 13:
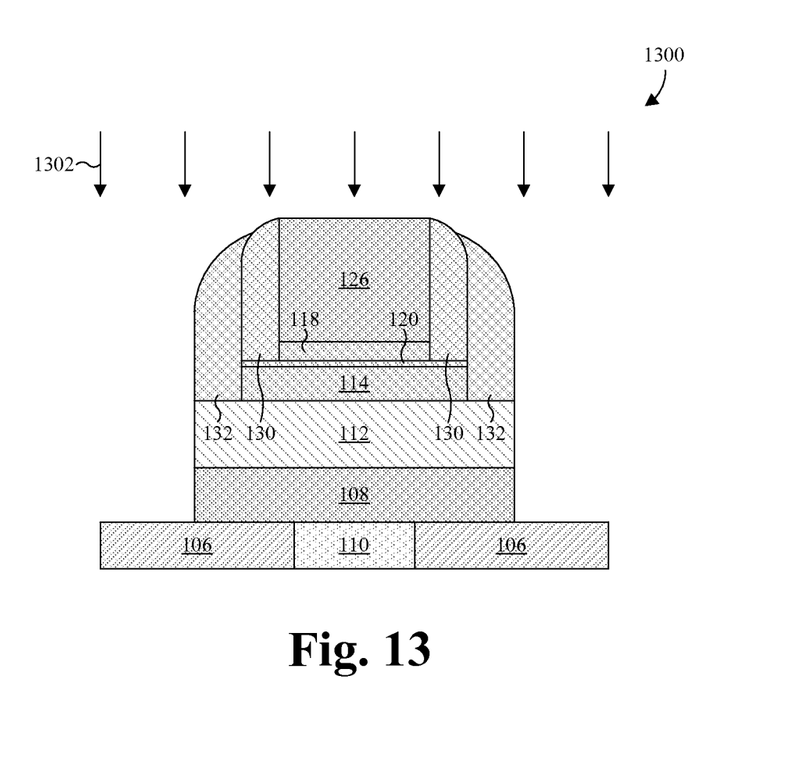

FIG. 13 illustrates a cross-sectional view 1300 of some embodiments corresponding to Act 314.

As illustrated by FIG. 13, a sixth etch is performed to the etch stop layer 106 through regions of the anti-ferromagnetic layer 112' and the bottom electrode layer 108' unmasked by the remaining hard mask, first sidewall spacer, and second sidewall spacer layers 130", 132", 502"'". The process for the sixth etch may include exposing the anti-ferromagnetic layer 112' and the bottom electrode layer 108' to an etchant 1302 for a period of time sufficient to etch through the combined thickness of the anti-ferromagnetic layer 112' and the bottom electrode layer 108'. The etchant 1302 is typically preferential of the anti-ferromagnetic layer 112' and the bottom electrode layer 108' relative to the remaining hard mask layer 502'" and the etch stop layer 106. In some embodiments, as illustrated, the etchant 1302 may erode one or more of the remaining hard mask layer 502"", the remaining first sidewall spacer layer 130"", and the remaining second sidewall spacer layer 132".

Advantageously, the remaining first sidewall spacer layer 130"" and the second sidewall spacer layer 132" protect the remaining free layer 118 from the etchant 1302. Further, the second sidewall spacer layer 132" advantageously protects the remaining pin layer 114 from the etchant 1302. The foregoing reduces the likelihood of damage to the remaining pin and free layers 114, 118 from the etchant 1302. Further, the foregoing reduces the likelihood of re-deposition of by-product on sidewalls of the remaining pin and free layers 114, 118. As described above, such damage and/or re-deposition can lead to increased leakage current and/or reduced data retention of the MRAM cell being formed.

Figure 14:
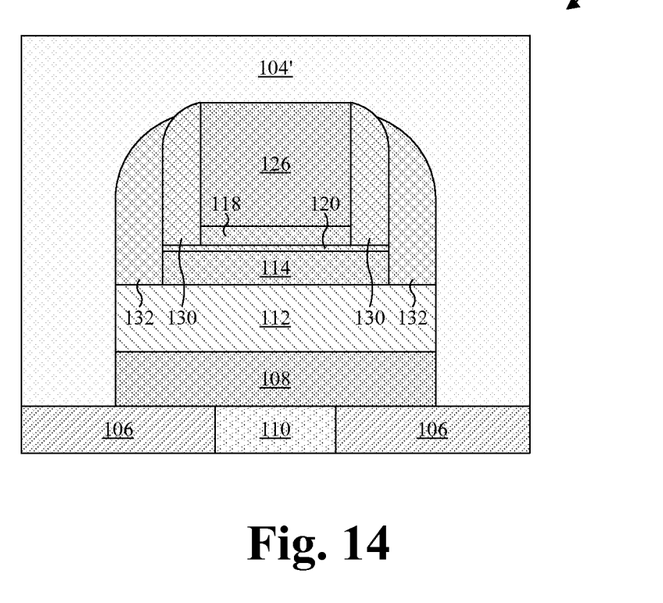

FIG. 14 illustrates a cross-sectional view 1400 of some embodiments corresponding to Act 316.

As illustrated by FIG. 14, an ILD layer 104' is formed over the etch stop layer 106, and over and surrounding the remaining bottom electrode, anti-ferromagnetic, first sidewall spacer, second sidewall spacer, and top electrode layers 108, 112, 126, 130, 132. To the extent that any of the hard mask layer remains, the ILD layer 104' is also formed over and around the remaining hard mask layer. The process for forming the ILD layer 104' may include forming an initial ILD layer and performing a chemical mechanical polish (CMP) to planarize a top surface of the initial ILD layer over the remaining top electrode layer 126.

Figure 15:
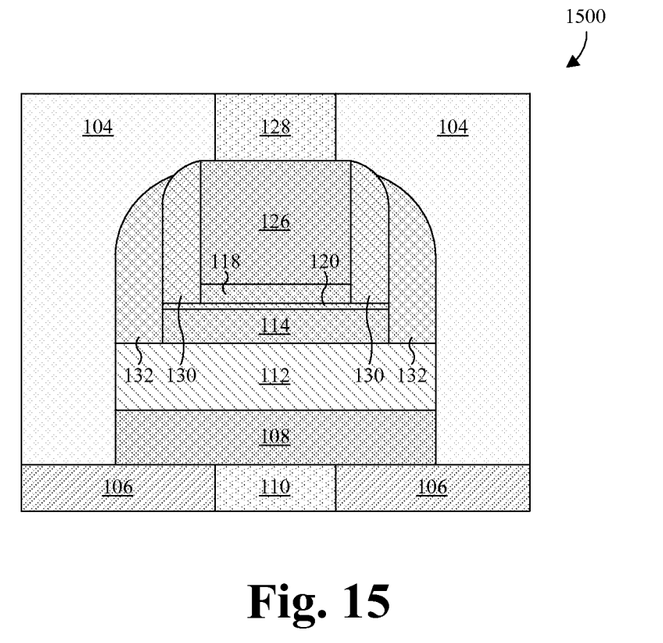

FIG. 15 illustrates a cross-sectional view 1500 of some embodiments corresponding to Act 318. As illustrated by FIG. 15, a via 128 is formed extending through the ILD layer 104' to the remaining top electrode layer 126. The process for forming the via 128 may include performing a selective etch to form a via opening in the ILD layer 104 that exposes the remaining top electrode layer 126. The process may then continue by forming a conductive layer filling the via opening and, in some embodiments, performing a CMP into the conductive layer. The via 128 may be formed of, for example, a metal, such as tungsten or copper.

Thus, in some embodiments, the present disclosure provides a MRAM cell comprising an anti-ferromagnetic layer, a pin layer, a free layer, a first sidewall spacer layer, and a second sidewall spacer layer. The pin layer is arranged over the anti-ferromagnetic layer and has a fixed magnetic polarity. The free layer is arranged over the pin layer and has a variable magnetic polarity. The first sidewall spacer layer extends from over the pin layer along sidewalls of the free layer. The second sidewall spacer layer extends from over the anti-ferromagnetic layer along sidewalls of the pin layer and the first sidewall spacer layer.

In other embodiments, the present disclosure provides a method for manufacturing a MRAM cell. A MRAM stack is formed comprising an anti-ferromagnetic layer, a pin layer, a barrier layer, and a free layer stacked in that order. A hard mask layer is formed over the MRAM stack and masking a device region of the MRAM stack. A first etch is performed to the barrier layer through regions of the free layer unmasked by the hard mask layer. A first sidewall spacer layer is formed extending from over the barrier layer, along sidewalls of the remaining free layer and the hard mask layer, to a point below or about even with a top surface of the hard mask layer. A second etch is performed to the anti-ferromagnetic layer through regions of the barrier and pin layers unmasked by the hard mask layer and the first sidewall spacer layer. A second sidewall spacer layer is formed extending from over the anti-ferromagnetic layer, along sidewalls of the remaining barrier and pin layers, to a point below or about even with the top surface of the hard mask layer.

In yet other embodiments, the present disclosure provides an integrated circuit comprising a MRAM cell and a BEOL metallization stack. The MRAM cell comprises a bottom electrode layer, an anti-ferromagnetic layer, a pin layer, a barrier layer, a free layer, and a top electrode layer stacked in that order. The pin layer and the free layer respectively have permanent and variable magnetic polarities. The MRAM cell further comprises a first sidewall spacer layer and a second sidewall spacer layer. The first sidewall spacer layer extends from over the pin layer along sidewalls of the free layer and the top electrode layer. The second sidewall spacer layer extends from over the anti-ferromagnetic layer along sidewalls of the pin layer, the barrier layer, and the first sidewall spacer layer. The BEOL metallization stack comprises a first metallization layer and a second metallization layer stacked on opposing sides of the MRAM cell. Further, the BEOL metallization stack comprises a first via and a second via. The first via extends from the bottom electrode layer to the first metallization layer, and the second via extends from the top electrode layer to the second metallization layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a magnetoresistive random-access memory (MRAM) cell, the method comprising:
    forming a MRAM stack comprising an anti-ferromagnetic layer, a pin layer, a barrier layer, and a free layer stacked in that order;
    forming a hard mask layer over the MRAM stack and masking a device region of the MRAM stack;
    performing a first etch to the barrier layer through regions of the free layer unmasked by the hard mask layer;
    forming a first sidewall spacer layer extending from over the barrier layer, along sidewalls of the remaining free layer and the hard mask layer, to a point below or about even with a top surface of the hard mask layer;
    performing a second etch to the anti-ferromagnetic layer through regions of the barrier and pin layers unmasked by the hard mask layer and the first sidewall spacer layer; and
    forming a second sidewall spacer layer extending from over the anti-ferromagnetic layer, along sidewalls of the remaining barrier and pin layers, to a point below or about even with the top surface of the hard mask layer, wherein forming the second sidewall spacer layer includes:
        forming an intermediate sidewall spacer layer over the anti-ferromagnetic layer, and lining the hard mask layer, the remaining pin and barrier layers, and the first sidewall spacer layer; and
        performing a third etch into the intermediate sidewall spacer layer to remove lateral stretches of the intermediate sidewall spacer layer, wherein the third etch is performed until a top surface of the intermediate sidewall spacer layer arcs laterally from a tip of the intermediate sidewall spacer layer that contacts a top surface of the first sidewall spacer layer.

2. The method according to claim 1, further including:
    performing a fourth etch through regions of the anti-ferromagnetic layer unmasked by the hard mask layer, the first sidewall spacer layer, and the second sidewall spacer layer.

3. The method according to claim 2, further including:
    forming a bottom electrode layer underlying the anti-ferromagnetic layer; and
    performing the fourth etch through regions of the bottom electrode layer unmasked by the hard mask layer, the first sidewall spacer layer, and the second sidewall spacer layer.

4. The method according to claim 1, wherein forming the first sidewall spacer layer includes:
    forming a second intermediate sidewall spacer layer over the barrier layer, and lining the hard mask layer and the remaining free layer; and
    performing a fourth etch into the second intermediate sidewall spacer layer to etch the second intermediate spacer sidewall layer back to below or about even with the top surface of the hard mask layer.

5. The method according to claim 1, further including:
    forming a top electrode layer overlying the free layer and underlying the hard mask layer; and
    performing the first etch through regions of the top electrode layer unmasked by the hard mask layer.

6. The method according to claim 5, further including:
    forming an interlayer dielectric (ILD) layer over and around the first sidewall spacer layer, the second sidewall spacer layer, and the remaining top electrode layer; and
    forming a via extending through the ILD layer to the remaining top electrode layer.

7. The method according to claim 1, further including:
    forming the pin and free layers of a ferromagnetic material.

8. A method for manufacturing a magnetoresistive random-access memory (MRAM) cell, the method comprising:
    forming a MRAM stack comprising an anti-ferromagnetic layer, a pin layer, a barrier layer, and a free layer stacked in that order;
    forming a hard mask layer over the MRAM stack and masking a device region of the MRAM stack;
    performing a first etch to the barrier layer through regions of the free layer unmasked by the hard mask layer;

forming a first sidewall spacer layer extending from over the barrier layer, along sidewalls of the remaining free layer and the hard mask layer, to a point below or about even with a top surface of the hard mask layer;

performing a second etch to the anti-ferromagnetic layer through regions of the barrier and in layers unmasked by the hard mask layer and the first sidewall spacer layer; and forming a second sidewall spacer layer extending from over the anti-ferromagnetic layer, along sidewalls of the remaining barrier and pin layers, to a point below or about even with the top surface of the hard mask layer;

wherein the first and second etches each remove a portion of the hard mask layer.

9. The method according to claim 8, further including:
performing a third etch through regions of the anti-ferromagnetic layer unmasked by the hard mask layer, the first sidewall spacer layer, and the second sidewall spacer layer.

10. The method according to claim 9, further including:
forming a bottom electrode layer underlying the anti-ferromagnetic layer; and
performing the third etch through regions of the bottom electrode layer unmasked by the hard mask layer, the first sidewall spacer layer, and the second sidewall spacer layer.

11. The method according to claim 8, wherein forming the first sidewall spacer layer includes:
forming an intermediate sidewall spacer layer over the barrier layer, and lining the hard mask layer and the remaining free layer; and
performing a third etch into the intermediate sidewall spacer layer to etch the intermediate spacer sidewall layer back to below or about even with the top surface of the hard mask layer.

12. The method according to claim 8, further including:
forming a top electrode layer overlying the free layer and underlying the hard mask layer; and
performing the first etch through regions of the top electrode layer unmasked by the hard mask layer.

13. The method according to claim 12, further including:
forming an interlayer dielectric (ILD) layer over and around the first sidewall spacer layer, the second sidewall spacer layer, and the remaining top electrode layer; and
forming a via extending through the ILD layer to the remaining top electrode layer.

14. The method according to claim 8, further including:
forming the pin and free layers of a ferromagnetic material.

15. A method for manufacturing a magnetoresistive random-access memory (MRAM) cell, the method comprising:
forming a MRAM stack comprising an anti-ferromagnetic layer, a pin layer, a barrier layer, and a free layer stacked in that order;
forming a hard mask layer over the MRAM stack and masking a device region of the MRAM stack;
performing a first etch to the barrier layer through regions of the free layer unmasked by the hard mask layer;
forming a first sidewall spacer layer extending from over the barrier layer, along sidewalls of the remaining free layer and the hard mask layer, to a point below or about even with a top surface of the hard mask layer;

performing a second etch to the anti-ferromagnetic layer through regions of the barrier and pin layers unmasked by the hard mask layer and the first sidewall spacer layer, wherein the first and second etches each remove a portion of the hard mask layer; and forming a second sidewall spacer layer extending from over the anti-ferromagnetic layer, along sidewalls of the remaining barrier and pin layers, to a point below or about even with the top surface of the hard mask layer, wherein forming the second sidewall spacer layer comprises:
forming an intermediate sidewall spacer layer over the anti-ferromagnetic layer, and lining the hard mask layer, the remaining pin and barrier layers, and the first sidewall spacer layer; and
performing a third etch into the intermediate sidewall spacer layer to remove lateral stretches of the intermediate sidewall spacer layer, wherein the third etch is performed until a top surface of the intermediate sidewall spacer layer arcs laterally from a tip of the intermediate sidewall spacer layer that contacts a top surface of the first sidewall spacer layer.

16. The method according to claim 15, further including:
performing a fourth etch through regions of the anti-ferromagnetic layer unmasked by the hard mask layer, the first sidewall spacer layer, and the second sidewall spacer layer.

17. The method according to claim 16, further including:
forming a bottom electrode layer underlying the anti-ferromagnetic layer; and
performing the fourth etch through regions of the bottom electrode layer unmasked by the hard mask layer, the first sidewall spacer layer, and the second sidewall spacer layer.

18. The method according to claim 15, wherein forming the first sidewall spacer layer includes:
forming a second intermediate sidewall spacer layer over the barrier layer, and lining the hard mask layer and the remaining free layer; and
performing a fourth etch into the second intermediate sidewall spacer layer to etch the second intermediate spacer sidewall layer back to below or about even with the top surface of the hard mask layer.

19. The method according to claim 15, further including:
forming a top electrode layer overlying the free layer and underlying the hard mask layer; and
performing the first etch through regions of the top electrode layer unmasked by the hard mask layer.

20. The method according to claim 19, further including:
forming an interlayer dielectric (ILD) layer over and around the first sidewall spacer layer, the second sidewall spacer layer, and the remaining top electrode layer; and
forming a via extending through the ILD layer to the remaining top electrode layer.

* * * * *